United States Patent
Sato et al.

(10) Patent No.: US 6,853,505 B2
(45) Date of Patent: Feb. 8, 2005

(54) OPTICAL MODULE APPARATUS, PROJECTION TELEVISION AND METHOD OF FABRICATING OPTICAL MODULE APPARATUS

(75) Inventors: Ko Sato, Yokohama (JP); Kazuyoshi Fuse, Yokohama (JP); Masanobu Kimura, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 7 days.

(21) Appl. No.: 10/607,573

(22) Filed: Jun. 27, 2003

(65) Prior Publication Data

US 2004/0075917 A1 Apr. 22, 2004

(30) Foreign Application Priority Data

Jun. 28, 2002 (JP) .......................................... 2002-189946

(51) Int. Cl.[7] ................................................. G02B 7/02
(52) U.S. Cl. ....................... 359/821; 359/819; 359/824; 359/823
(58) Field of Search ................................ 359/821, 819, 359/823, 824, 820, 815, 811

(56) References Cited

U.S. PATENT DOCUMENTS

| | | | | |
|---|---|---|---|---|
| 6,345,138 B1 | * | 2/2002 | Kawai et al. | 385/49 |
| 6,345,139 B1 | * | 2/2002 | Fuse et al. | 385/49 |
| 6,483,968 B2 | | 11/2002 | Fuse et al. | |
| 2003/0035361 A1 | * | 2/2003 | Knight et al. | 369/112.24 |

FOREIGN PATENT DOCUMENTS

| | | |
|---|---|---|
| JP | 8-75939 | 3/1996 |
| JP | 8-204288 | 8/1996 |
| JP | 11-97800 | 4/1999 |
| JP | 3059171 | 3/2001 |

* cited by examiner

Primary Examiner—Ricky Mack
Assistant Examiner—Brandi Thomas
(74) Attorney, Agent, or Firm—Pillsbury Winthrop LLP

(57) ABSTRACT

An optical module apparatus comprises a first optical element, a first member which holds the first optical element, a second optical element placed near the first optical element, and a second member which holds the second optical element. A plurality of wedges are arranged at a plurality of positions between the first member and the second member thereby to hold the relative positions of the first optical element and the second optical element.

20 Claims, 8 Drawing Sheets

OPTICAL MODULE APPARATUS, PROJECTION TELEVISION AND METHOD OF FABRICATING OPTICAL MODULE APPARATUS

CROSS-REFERENCE TO RELATED APPLICATIONS

This application is based upon and claims the benefit of priority from the prior Japanese Patent Application No. 2002-189946, filed Jun. 28, 2002, the entire contents of which are incorporated herein by reference.

BACKGROUND OF THE INVENTION

1. Field of the Invention

The present invention relates to an optical module apparatus for optically coupling optical elements to each other with a low loss, or more in particular to an optical module apparatus for holding an optically coupled state using a plurality of wedges, a method of fabricating the optical module apparatus and a projection television using the same.

2. Description of Related Art

In mounting by integrating optical elements such as a semiconductor laser, an optical waveguide and an optical fiber as an optical module, it is indispensable that the optical elements be optically coupled with each other in stable fashion with a low loss. Mounting methods for optically coupling optical elements roughly include an active alignment and a passive alignment.

When a semiconductor laser and an optical waveguide are optically coupled to each other, for example, the active alignment method is basically used in such a manner that a semiconductor laser is generated, the light beam emitted from the semiconductor laser is coupled to the optical waveguide, and the output light power from the optical waveguide is monitored while searching for an optimum position and fixing the semiconductor laser and the optical waveguide at the particular position.

The passive alignment method, on the other hand, includes a method in which at least a fitting protrusion and a fitting recess are formed beforehand at a predetermined position on each of the board carrying the semiconductor laser and the holding member of the optical waveguide so that the optical coupling is established by fitting the protrusion and the recess to each other with a mechanical accuracy alone, and a method in which the semiconductor laser and the optical waveguide are fixed at the desired position utilizing the self-aligning effect of the molten solder in mounting the semiconductor laser and the optical waveguide on a board.

Generally, the active alignment method requires a three-dimensional positioning process to attain an optimum position. Since this positioning process leads to a high cost, most parts of the mounting process desirably remain unadjusted as in the passive alignment method.

Depending on the type and the configuration of the optical elements to be coupled, however, the passive alignment method may be difficult to implement. For example, consider the method disclosed in Japanese Patent No. 3059171. In this method, the output light of a W-class semiconductor laser, which is composed of an active layer about several hundred $\mu$m wide and about several $\mu$m thick and thus having extremely asymmetric horizontal and vertical sizes, is intended to be optically coupled with high efficiency to an optical fiber having a core diameter of several tens of $\mu$m.

According to this method, the optical coupling is realized in such a manner that an optical waveguide formed of a soft material such as silicone resin is placed directly butted against a light exit end surface of the semiconductor laser and an optical connecting end surface of the optical fiber. This method, in which the optical waveguide is formed of a soft material, makes it possible to bring the end surfaces of the semiconductor laser and the optical waveguide into direct contact with each other without damaging the light exit end surface of the semiconductor laser, thereby realizing the optical coupling with a low loss. Nevertheless, the fact that the optical waveguide is formed of a soft material unavoidably causes variations of the outer size of the optical waveguide ranging from several $\mu$m to a maximum of several tens of $\mu$m. Actually, therefore, the passive alignment method described above is very difficult to employ in mounting an optical module. Even in the active alignment method, the semiconductor laser and the optical waveguide cannot be easily fixed in stable fashion at an optimum position after adjustment.

Specifically, according to the prior art, the outer dimensions of the optical waveguide fabricated of a soft resin material such as silicon are difficult to control with high accuracy. In the passive alignment method including means for self alignment using the molten solder or fitting between protrusions and recesses, the optical waveguide cannot be easily connected optically with the optical element such as a semiconductor laser or an optical fiber with low loss. In the active alignment method, on the other hand, an optical module cannot be easily fixed in stable fashion.

In view of this, Jpn. Pat. Appln. KOKAI Publication No. 11-97800 discloses a technique of the semiconductor laser module in which the lens position is fixed with a wedge-type spacer. This technique can fix the lens at an optimum position using the wedge-type spacer. In this technique, however, the lens is fixed at upper and lower positions thereof, and unlike in the present invention, the problem is posed that the optical elements cannot be optically connected easily with the best optical efficiency under various circumstances.

Thus, the conventional optical module apparatus harbors the problem that a plurality of boards holding a plurality of optical elements, respectively, cannot be easily connected optically with a suppressed loss by being physically connected and fixed.

BRIEF SUMMARY OF THE INVENTION

According to one aspect of the invention, there is provided an optical module apparatus comprises a first optical element and a first member which supports the first optical element; a second optical element which is placed near the first optical element and a second member which holds the second optical element; and a plurality of wedges arranged at a plurality of positions between the first member and the second member to hold the relative positions of the first optical element and the second optical element.

DESCRIPTION OF THE PREFERRED EMBODIMENTS

An optical module apparatus, a method of fabricating the apparatus and a projection television having the optical module apparatus as a light source according to embodiments of the invention will be explained in detail below with reference to the accompanying drawings.

First Embodiment

Figure 1A:
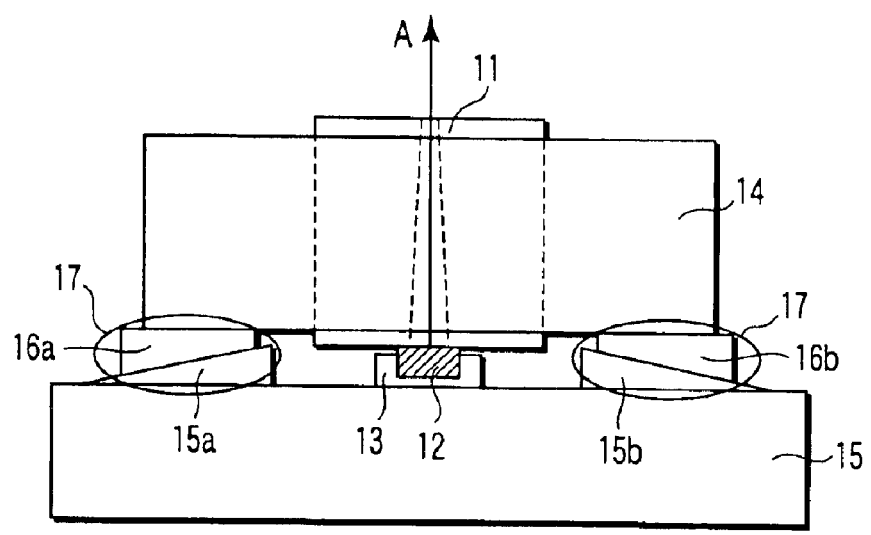
FIGS. 1A and 1B are a top plan view and a side view, respectively, of an optical module apparatus according to a first embodiment of the invention.
Figure 1B:
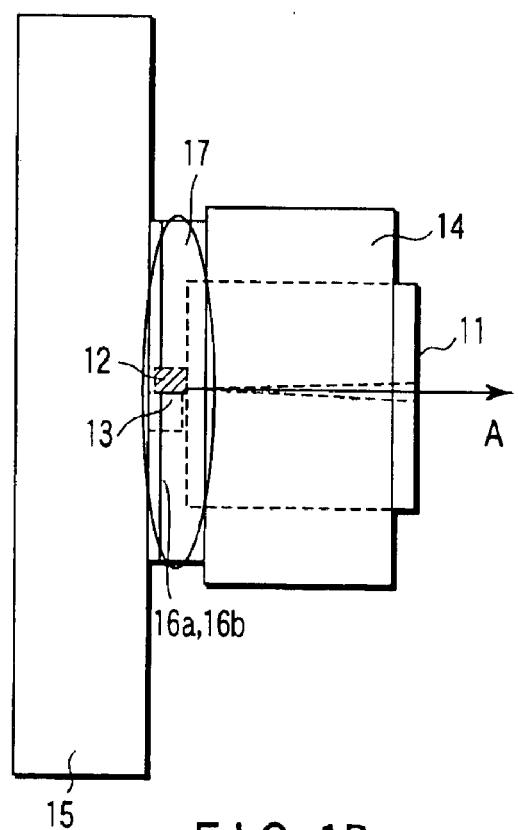

According to a first embodiment, there is provided an optical module apparatus in which the boards of a semiconductor laser and an optical waveguide are mutually held by a plurality of wedges. FIGS. 1A and 1B are a top plan view and a side view, respectively, of an optical module apparatus according to a first embodiment of the invention.

The optical module apparatus according to this invention comprises a semiconductor laser and an optical waveguide coupled integrally with each other as shown in the top plan view of FIG. 1A and the side view of FIG. 1B. Specifically, the optical module apparatus comprises an optical waveguide 11 composed of a resin material, a semiconductor laser 12, a semiconductor laser mount member 13, an optical waveguide holding member 14 and a board 15 with the semiconductor laser mounted thereon. Further, wedge-shaped protrusions 15a, 15b are arranged on the board with the semiconductor laser 12 mounted thereon, and wedges 16a, 16b are inserted between the member 14 for holding the optical waveguide 11 and the board 15 with the semiconductor laser mounted thereon. An ultraviolet-cured adhesive that has been hardened is designated by numeral 17. The arrow A indicates the main direction of light propagation.

In the optical module apparatus according to this invention described above, the light exit end surface of the semiconductor laser 12 and the light connecting end surface of the optical waveguide 11 are kept fixed in close contact with each other. The holding member 14 of the optical waveguide and the wedge-shaped protrusions 15a, 15b formed on the board 15 carrying the semiconductor laser 12 and the wedges 16a, 16b, respectively, are fixed to each other by the ultraviolet-cured adhesive 17. The wedge-shaped protrusions 15a and 15b are arranged substantially symmetrically with each other about a line, and so are the wedges 16a and 16b. Also, the wedges 16a, 16b are inserted at positions substantially symmetric with each other about the semiconductor laser 12 as a center point. Even when the members develop thermal expansion due to the heat generated during the operation of the semiconductor laser, therefore, the displacement of each member due to the thermal expansion acts in such a direction as to offset each other. Thus, a stable operation is realized without large displacement.

According to this embodiment, the wedges are inserted at two points. Nevertheless, the invention is not limited to it, but the number of insertion points can be increased or decreased in accordance with the size and shape of the optical waveguide. Also, the positions at which the wedges are inserted and the shape and size of the wedges are not limited to those described in this embodiment. Further, although the wedge-shaped protrusions 15a, 15b are arranged on the board 15 carrying the semiconductor laser 12 in this embodiment, the invention is not necessarily limited to this configuration, but an equivalent structure having an equivalent function can alternatively be employed.

Also, the optical elements are not confined to the semiconductor laser and the optical waveguide described above, but other optical elements having equivalent functions and effects can be employed.

As described above, with an optical module apparatus according to the first embodiment, the board 15 with the semiconductor laser 12 mounted thereon and the member 14 for holding the optical waveguide 11 are fixed using the ultraviolet-cured adhesive 17 by means of a plurality of the wedge-shaped protrusions 15a, 15b and the wedges 16a, 16b. As a result, an optical module apparatus is provided which can maintain the optical coupling of the optical elements very easily with an optimum efficiency.

Figure 2A:
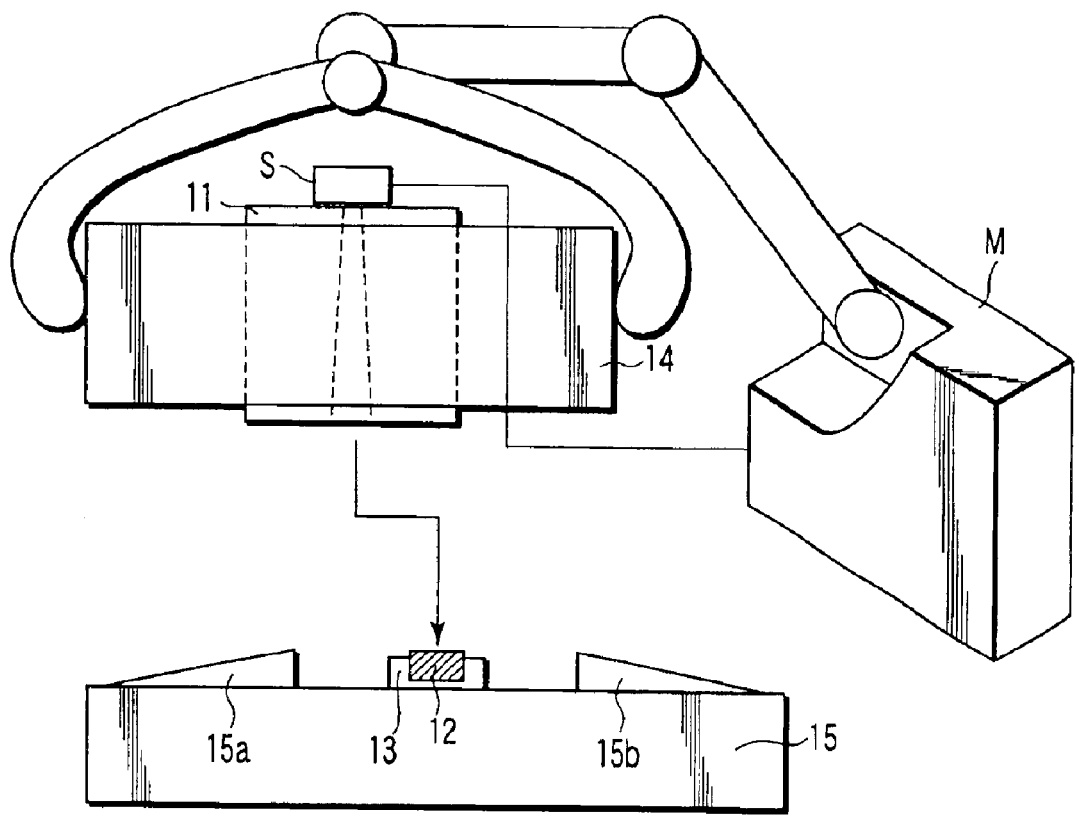
FIGS. 2A and 2B are diagrams for explaining the steps of fabrication of an optical module apparatus according to the first embodiment of the invention.
Figure 2B:
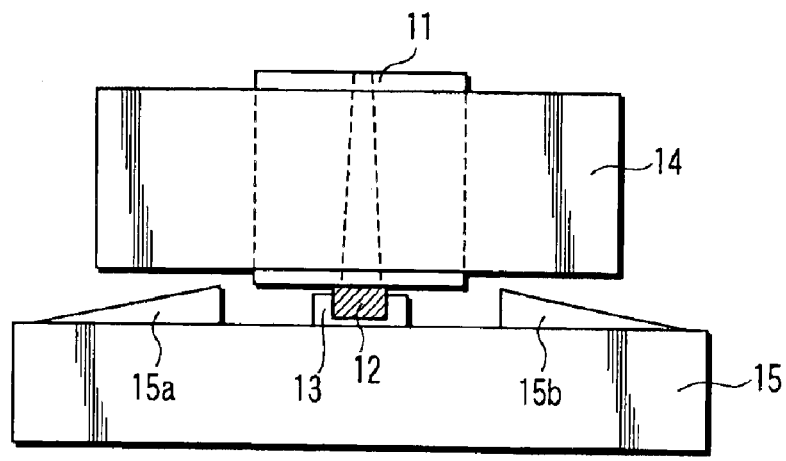

Method of Fabricating an Optical Module Apparatus According to the Invention A method of fabricating an optical module apparatus according to a first embodiment will be explained with reference to FIGS. 2A, 2B and FIGS. 3A, 3B, 3C. First, as shown in FIG. 2A, the position of the member 14 for holding the optical waveguide 11 is adjusted using a multi-axial control stage unit M. In this way, the light exit end surface of the semiconductor laser 12 mounted on the mount member 13 on the board 15 and the light connecting end surface of the optical waveguide 11 held by the holding member 14 are coupled in butted relation to each other. In the process, as shown in FIG. 2B, the light output power radiated from the optical waveguide 11 is monitored with a sensor S or the like while radiating the laser beam from the semiconductor laser 12, and at the same time the relative positions of the semiconductor laser 12 and the optical waveguide 1 are optimized in such a manner that the light exiting from the semiconductor laser 12 is coupled to the optical waveguide 11 with minimum loss. Similarly in other embodiments, the relative positions are optimized by moving the positions of the intended optical elements while monitoring them with a sensor S or the like and thus finding out the positions of minimum loss.

Figure 3A:
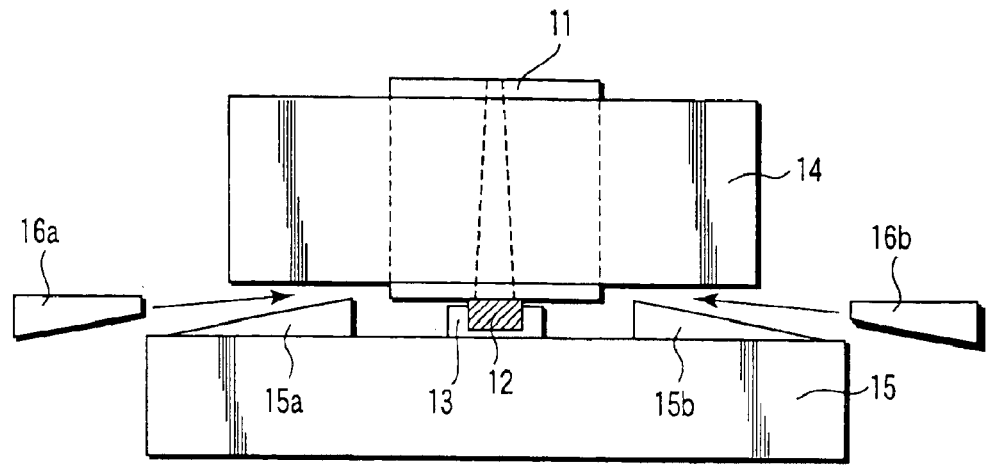
FIGS. 3A, 3B and 3C are diagrams for explaining the steps of fabrication of an optical module apparatus according to the first embodiment of the invention.
Figure 3B:
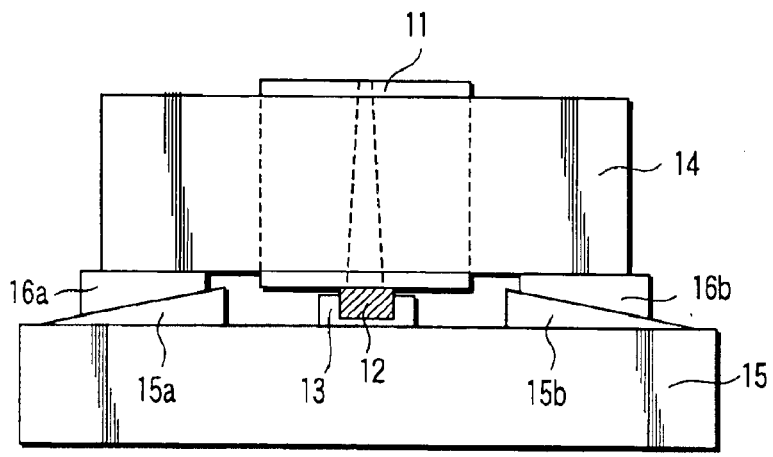
Figure 3C:
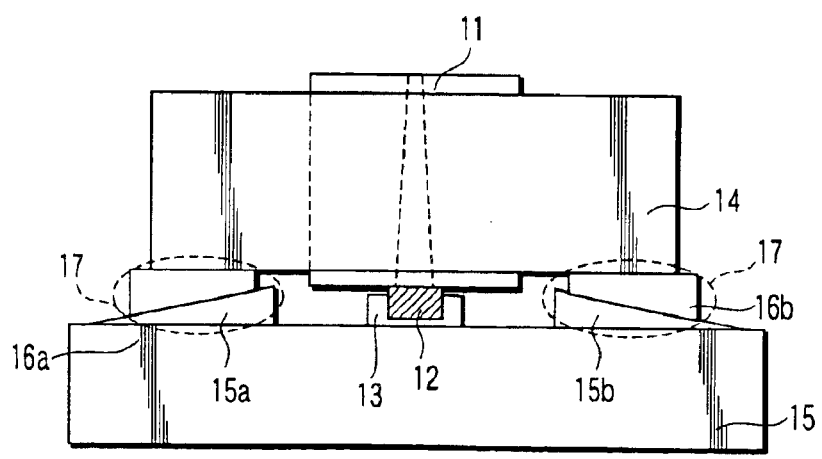

Once the positions are optimized, as shown in FIGS. 3A, 3B, the wedges 16a, 16b are inserted, respectively, in the spaces between the wedge-shaped protrusions 15a, 15b arranged on the board 15 carrying the semiconductor laser 12 and the optical waveguide holding member 14. Further, as shown in FIG. 3C, an ultraviolet-cured adhesive 17 is dripped near the contact portions between the protrusions 15a, 15b, the wedges 16a, 16b and the optical waveguide holding member 14. The output light power from the optical waveguide 11 is measured with a sensor S or the like, and once the optically coupled state with the semiconductor laser 12 with low loss has been confirmed, ultraviolet rays are radiated on the ultraviolet-cured adhesive 17 that has been dripped, thereby fixing the board 15 carrying the semiconductor laser 12, the holding member 14 of the optical waveguide 11 and the wedges 16a, 16b.

When the coupling portion between the semiconductor laser 12 and the optical waveguide 11 is displaced at the time of inserting the wedges 16a, 16b, and the output light power from the optical waveguide 11 is reduced, the relative positions of the semiconductor laser 12 and the optical waveguide 11 are adjusted again by use of the multi-axial control stage unit M. After complete readjustment at an optimum position, the ultraviolet rays are radiated on the ultraviolet-cured adhesive.

Through the procedure described above, the optical module apparatus shown in FIGS. 1A, 1B can be fabricated. According to this embodiment, the wedge-shaped protrusions 15a, 15b are arranged in advance on the board 15 carrying the semiconductor laser. Nevertheless, the invention is not necessarily confined to this configuration. Instead, the functions and effects of the invention can of course be achieved based on the same principle also when wedge-shaped protrusions are formed in advance, for example, on the butting surface side of the holding member 14 of the optical waveguide 11.

Second Embodiment

Figure 4A:
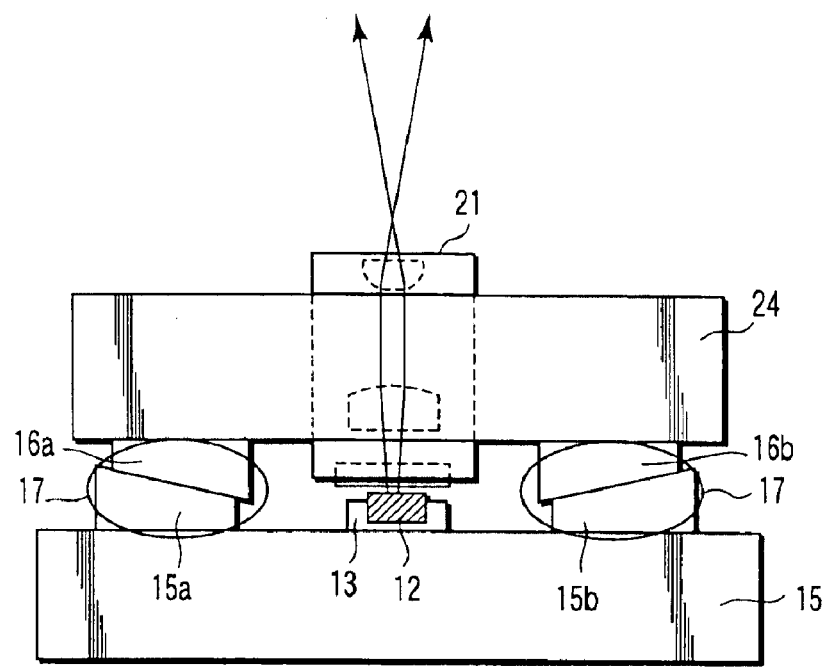
FIGS. 4A and 4B are a top plan view and a side view, respectively, of an optical module apparatus according to a second embodiment of the invention.
Figure 4B:
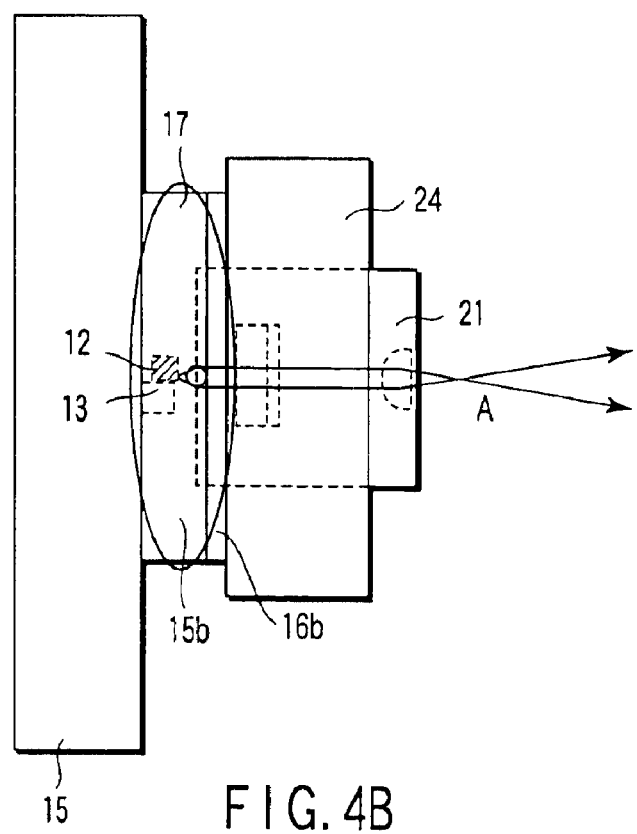

According to a second embodiment, there is provided an optical module apparatus in which the space between the boards of the semiconductor laser and the lens unit is held by a plurality of wedges. Also, a method of fabricating this optical module apparatus will be referred to. FIGS. 4A and 4B are a top plan view and a side view, respectively, of an optical module apparatus according to the second embodiment of the invention.

In the second embodiment, as shown in FIGS. 4A and 4B, a lens unit 21 is used instead of the optical waveguide 11, with a member 24 for holding the lens unit 21. According to this embodiment, therefore, the lens unit 21 and the semiconductor laser 12 are kept out of contact and required to be fixed in a predetermined spaced relation with each other. As in the first embodiment, the optical module apparatus is fixed by using wedge-shaped protrusions or wedge members at a plurality of points. In this way, an optical module apparatus is provided in which the optical coupling between the optical elements can be maintained easily and accurately with optimal efficiency.

Third Embodiment

Figure 5A:
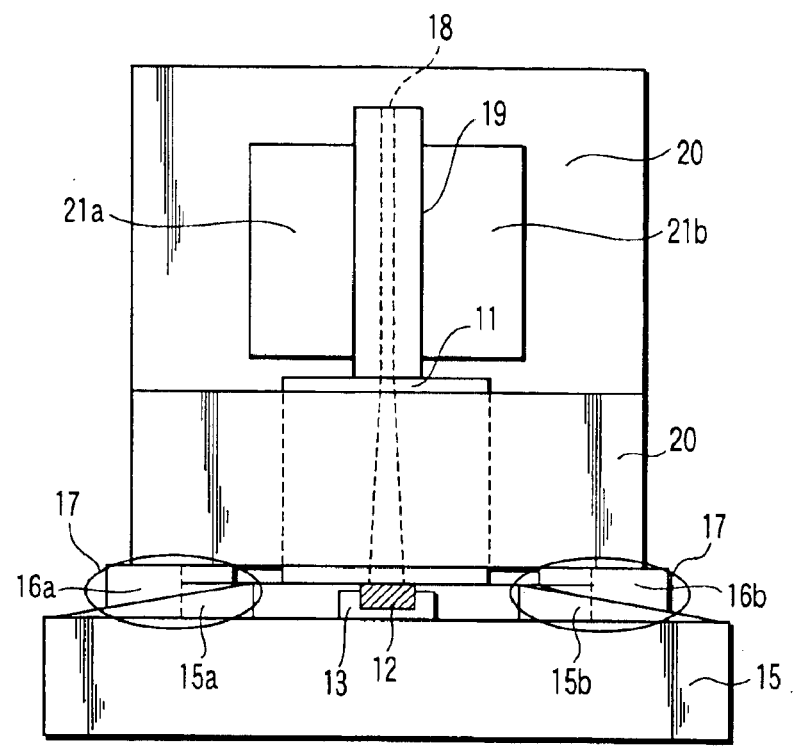
FIGS. 5A and 5B are a top plan view and a side view, respectively, of an optical module apparatus according to a third embodiment of the invention.
Figure 5B:
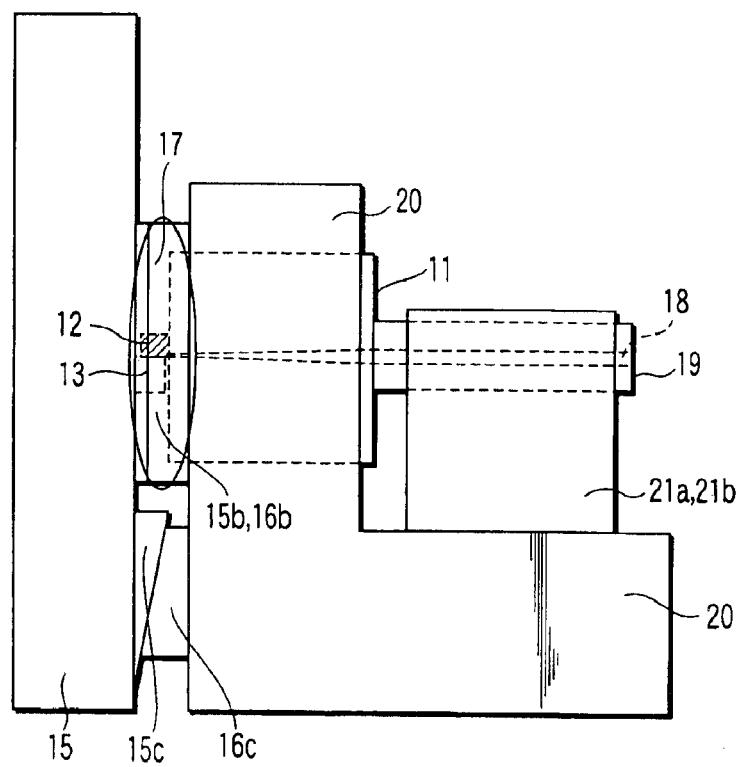
Figure 6A:
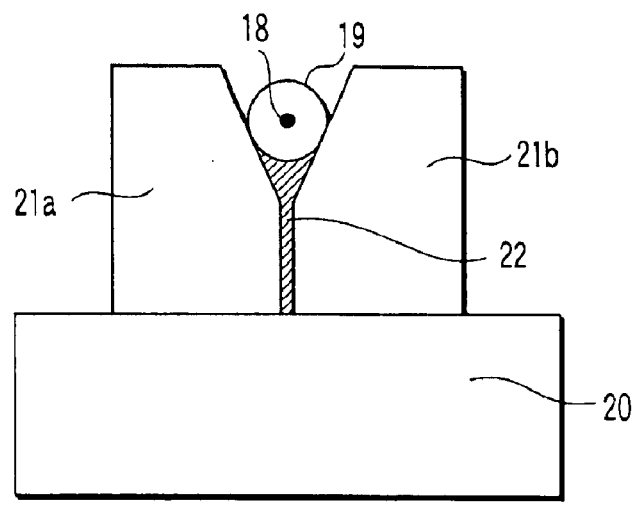
FIGS. 6A and 6B are a sectional view and a perspective view, respectively, of an optical module apparatus according to the third embodiment of the invention.
Figure 6B:
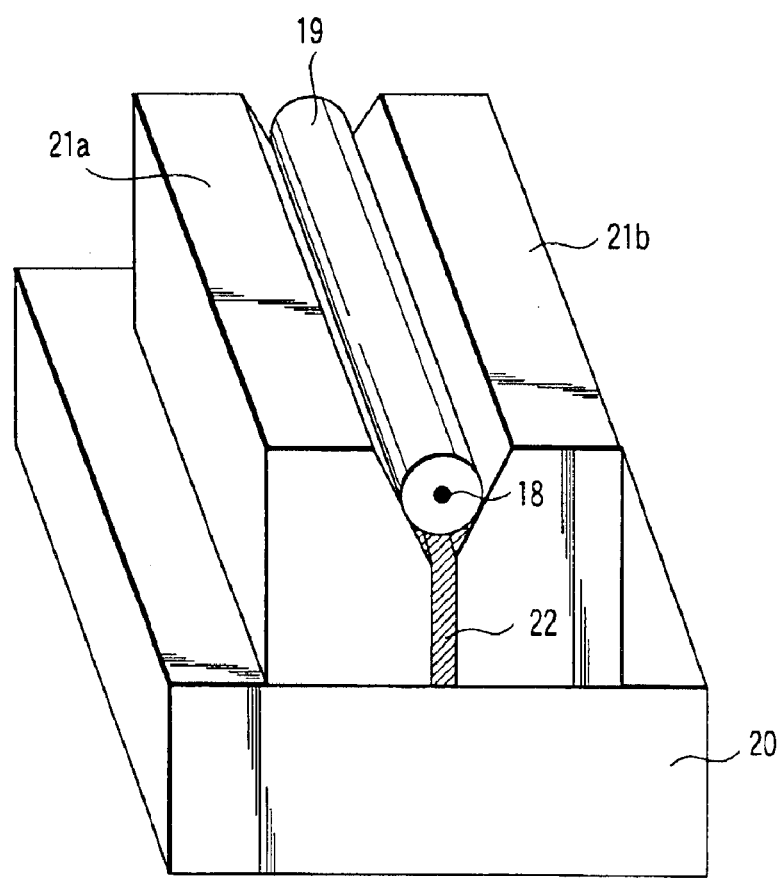

According to a third embodiment, there is provided an optical module apparatus in which an optical fiber is held by a plurality of wedges to optimize the optical coupling between the optical fiber and other optical elements. FIGS. 5A and 5B are a top plan view and a side view, respectively, showing an optical module apparatus according to the third embodiment of the invention, and FIGS. 6A and 6B are a sectional view and a perspective view, respectively, of the same optical module apparatus.

FIGS. 5A and 5B are for explaining a general configuration of the optical module apparatus according to the third embodiment of the invention. FIG. 5A is a top plan view, FIG. 5B a side view, FIG. 6A a front view and FIG. 6B a perspective view. In FIGS. 6A and 6B, the component parts requiring no explanation are not shown.

In the optical module apparatus shown in FIGS. 5A, 5B and 6A, 6B, an optical fiber 18 integrated with a ferrule 19 is connected fixedly to the output end of the optical waveguide of the optical module apparatus according to the first embodiment. The component parts similar to the corresponding ones of the first embodiment will not be described again.

In FIGS. 5A, 5B and FIGS. 6A, 6B, the optical fiber 18 is inserted in the ferrule 19, and a pair of wedges 21a, 21b are inserted between a partly L-shaped optical waveguide holding board 20 and the ferrule 19. These component parts are fixed to each other with an ultraviolet-cured adhesive.

The optical waveguide 11 and the optical fiber 18 are coupled and fixed to each other by a method equivalent to the method of coupling the optical waveguide 11 and the semiconductor laser 12 according to the first embodiment and will not be described again.

As described above, according to the third embodiment of the invention, the optical fiber 18 inserted in the ferrule 19 is optically coupled with other optical elements with low loss, and in order to maintain this status, a pair of the wedge-shaped members 21a, 21b shown in FIG. 6B are used to fixedly hold them. As a result, according to the third embodiment of the invention, an optical module apparatus is provided which can easily and very accurately realize the optical coupling capable of retrieving the output light of the semiconductor laser from the optical fiber.

Fourth Embodiment

Figure 7A:
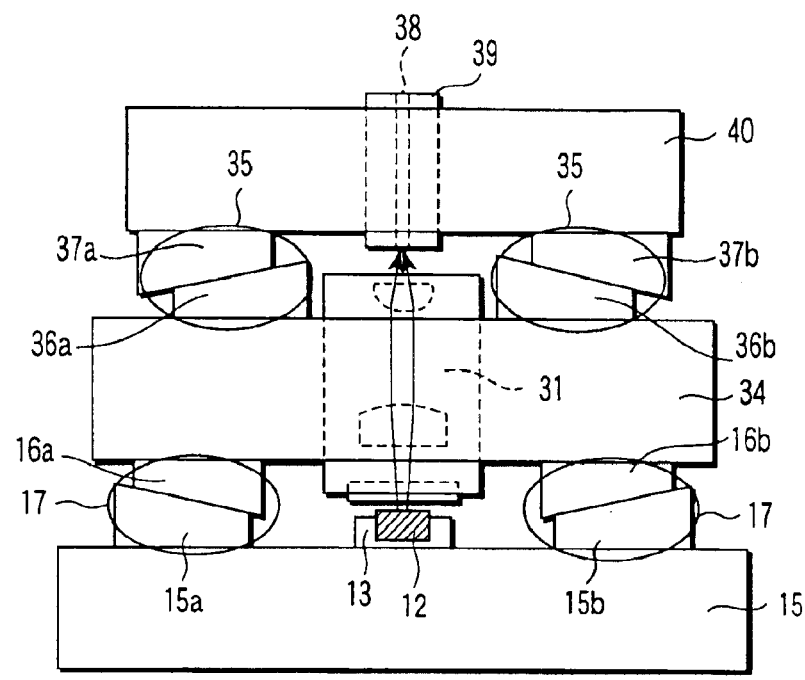
FIGS. 7A and 7B are a top plan view and a side view, respectively, of an optical module apparatus according to a fourth embodiment of the invention.
Figure 7B:
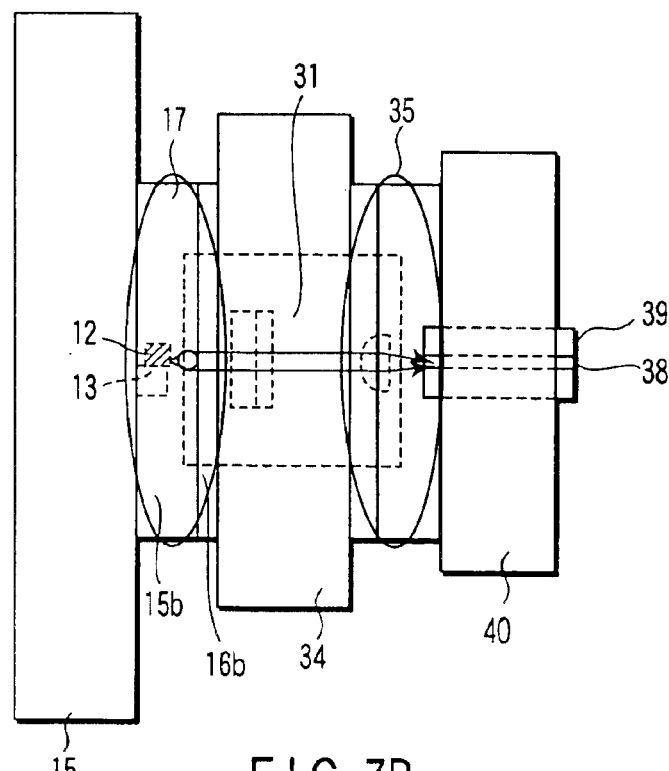

According to a fourth embodiment of the invention, there is provided an optical module apparatus in which the boards of a semiconductor laser, a lens unit and an optical fiber are held by a plurality of wedges inserted between them. FIGS. 7A and 7B are a top plan view and a side view, respectively, showing an optical module apparatus according to a fourth embodiment of the invention.

In the fourth embodiment, a holding board 40 for holding the ferrule 39 with the optical fiber 38 inserted therein is added to the optical module in which the boards of the semiconductor laser and the lens unit included in the second embodiment unit are held by a plurality of wedges inserted between them. Further, the board 40 and the lens unit board 34 are fixed to each other by means of a plurality of wedges 36a, 37a, 36b, 37b using an ultraviolet-cured resin 35 or the like.

An optical module apparatus according to the fourth embodiment described above is used with a light source of a projection television according to a fifth embodiment, for example, described later. Also in the fourth embodiment, a highly accurate, strong optical coupling can be realized by a simple configuration as in the aforementioned embodiments.

Fifth Embodiment

Figure 8:
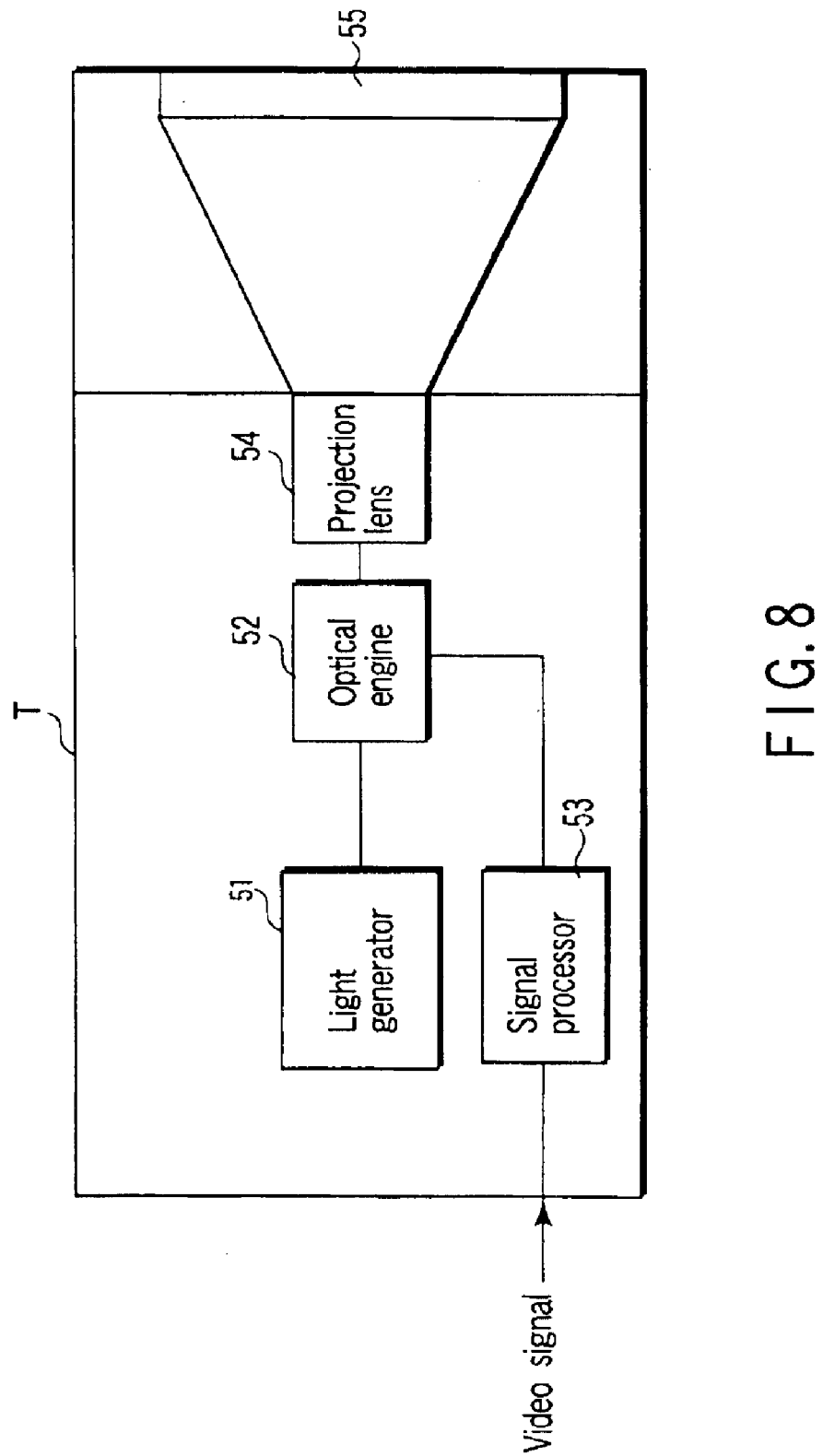
FIG. 8 is a block diagram showing a projection television using an optical module apparatus according to a fifth embodiment of the invention.

According to a fifth embodiment of the invention, there is provided a projection television comprising an optical module apparatus according to the invention used as a light source. FIG. 8 is a block diagram showing a projection television using an optical module apparatus according to the fifth embodiment of the invention.

The projection television T according to the fifth embodiment, as shown in FIG. 8, comprises at least a light source 51 having the structure shown in the fourth embodiment, a signal processor 53 for processing the video signal supplied from an external source, in a predetermined way, and supplying a control signal to an optical engine 52, the optical engine 52 composed of a DMD or a liquid crystal irradiated with light from the light source 51 for generating an image light in accordance with the control signal, and a projection lens 54 for receiving the image light from the optical engine 52 and projecting it on the display 55.

The optical module apparatus according to this invention realizes a highly accurate positioning and a low fabrication cost at the same time by using wedges at a plurality of points. The use of this optical module apparatus with the light source of the projection television described in the fifth embodiment, for example, can produce a high-quality reproduced image.

Based on the various embodiments described above, those skilled in the art can achieve the invention. Further, various modifications of the embodiments can be easily conceived by those skilled in the art, and the invention is applicable to various embodiments without an inventive ability. Thus, the present invention covers a wide range of applications without departing from the principle and the new features disclosed above, and is not limited to the embodiments described above.

It will thus be understood from the foregoing detailed description that according to this invention, there is provided an optical module apparatus in which a stable optical coupling between optical elements can be maintained with maximum efficiency by connecting the boards of the optical elements at a plurality of points using wedge-shaped members.

What is claimed is:

1. An optical module apparatus comprising:
a first optical element and a first member which holds the first optical element;
a second optical element placed near the first optical element and a second member which holds the second optical element; and
a plurality of wedges arranged at a plurality of positions between the first member and the second member to hold the relative positions of the first optical element and the second optical element.

2. An optical module apparatus according to claim 1, wherein the first member and the second member are arranged at positions where the loss of the light beam radiated from the first optical element to the second optical element is minimum, then the wedges are fixedly inserted in at least a plurality of positions in the space between the first member and the second member.

3. An optical module apparatus according to claim 1, wherein the light beam radiated from the first optical element and emitted from the second optical element is detected by a sensor while moving at least selected one of the first member and the second member so that the first member and the second member are arranged at a position of a minimum loss of the light beam radiated on the second optical element, then the wedges are fixedly inserted in at least a plurality of positions in the space between the first member and the second member thereby to maintain the relative positions of the first optical element and the second optical element.

4. An optical module apparatus according to claim 1, wherein the first optical element is a semiconductor laser and the second optical element is an optical waveguide which receives the laser beam from the semiconductor laser.

5. An optical module apparatus according to claim 1, wherein the first optical element is a semiconductor laser and the second optical element is a lens unit which receives the laser beam from the semiconductor laser.

6. An optical module apparatus according to claim 1, wherein a plurality of the wedges fixedly hold the second member.

7. An optical module apparatus according to claim 1, further comprising:
a third optical element placed near the second optical element and a third member which holds the third optical element; and
a plurality of second wedges arranged at a plurality of positions between the second member and the third member which maintains the relative positions of the second optical element and the third optical element.

8. An optical module apparatus according to claim 1, wherein a plurality of the wedges regulate the space between the first member and the second member in the direction parallel to the optical axis along the light path between the first optical element and the second optical element thereby to maintain the relative positions of the first optical element and the second optical element.

9. A method of fabricating an optical module apparatus, comprising:
arranging a second optical element and a second member which holds the second optical element, relatively to a first optical element and a first member which holds the first optical element in such a manner that the second member is moved while at the same time monitoring the optical efficiency between the first optical element and the second optical element, thereby arranging the second member at a position associated with the optimum optical efficiency; and
inserting a plurality of wedges at a plurality of positions, respectively, between the first member and the second member and fixing the wedges at positions associated with the optimum optical efficiency.

10. The method according to claim 9, wherein the wedges are fixed in such a manner that after inserting the wedges, an ultraviolet-cured resin is dripped, and then the ultraviolet rays are radiated thereby to cure the ultraviolet-cured resin.

11. The method according to claim 9, wherein the first optical element is a semiconductor laser and the second optical element is an optical waveguide which receives a laser beam from the semiconductor laser.

12. A projection television comprising:
a light source including a semiconductor laser, a first member which holds the semiconductor laser, a lens unit which is arranged near the semiconductor laser and receives the laser beam from the semiconductor laser, a second member which holds the lens unit, and a holding member having a plurality of wedges arranged at a plurality of positions between the first member and the second member thereby to maintain the relative positions of the semiconductor laser and the lens unit; and
a display which displays an image based on the video information supplied thereto, using the light beam radiated from the light source.

13. An optical module apparatus comprising:
a first means for holding a first optical element;
a second means for holding a second optical element placed near the first optical element; and
a plurality of wedge means for holding the relative positions of the first optical element and the second optical element, by arranged at a plurality of positions between the first means and the second means.

14. An optical module apparatus according to claim 13, wherein the first means and the second means are arranged at positions where the loss of the light beam radiated from the first optical element to the second optical element is minimum, then the wedge means are fixedly inserted in at least a plurality of positions in the space between the first means and the second means.

15. An optical module apparatus according to claim 13, wherein the light beam radiated from the first optical element and emitted from the second optical element is detected by a sensor while moving at least selected one of the first means and the second means so that the first means and the second means are arranged at a position of a minimum loss of the light beam radiated on the second optical element, then the wedge means are fixedly inserted in at least a plurality of positions in the space between the first means and the second means thereby to maintain the relative positions of the first optical element and the second optical element.

16. An optical module apparatus according to claim 13, wherein the first optical element is a semiconductor laser and the second optical element is an optical waveguide which receives the laser beam from the semiconductor laser.

17. An optical module apparatus according to claim 13, wherein the first optical element is a semiconductor laser and the second optical element is a lens unit which receives the laser beam from the semiconductor laser.

18. An optical module apparatus according to claim 13, wherein a plurality of the wedge means fixedly hold the second means.

19. An optical module apparatus according to claim 13, further comprising:

a third means for holding a third optical element placed near the second optical element; and a plurality of second wedge means for maintaining the relative positions of the second optical element and the third optical element, by arranged at a plurality of positions between the second means and the third means.

20. An optical module apparatus according to claim 13, wherein a plurality of the wedge means regulate the space between the first means and the second means in the direction parallel to the optical axis along the light path between the first optical element and the second optical element thereby to maintain the relative positions of the first optical element and the second optical element.

* * * * *